United States Patent [19]

Brown et al.

[11] Patent Number: 4,638,400
[45] Date of Patent: Jan. 20, 1987

[54] REFRACTORY METAL CAPACITOR STRUCTURES, PARTICULARLY FOR ANALOG INTEGRATED CIRCUIT DEVICES

[75] Inventors: Dale M. Brown; Manjin J. Kim, both of Schenectady; Richard D. Baertsch, Scotia; Thomas L. Vogelsong, Schenectady, all of N.Y.

[73] Assignee: General Electric Company, Schenectady, N.Y.

[21] Appl. No.: 790,911

[22] Filed: Oct. 24, 1985

[51] Int. Cl.[4] ............... H01G 1/015; B41M 3/08; H01L 27/02
[52] U.S. Cl. ................... 361/304; 29/577 C; 174/68.5; 357/51
[58] Field of Search .......... 338/314; 174/68.5; 357/51; 29/25.42, 569 R, 576 R, 577 C; 361/304, 402, 409; 204/15, 34.5

[56] References Cited

U.S. PATENT DOCUMENTS

| | | | |
|---|---|---|---|
| 3,359,467 | 12/1967 | Cook ........................... | 357/51 |
| 3,368,116 | 2/1968 | Spaude ..................... | 357/51 X |
| 3,597,834 | 8/1971 | Lathop et al. ............. | 174/68.5 X |
| 3,699,011 | 10/1972 | Nishimura ................. | 174/68.5 X |
| 4,075,756 | 2/1978 | Kircher et al. ............ | 29/577 C X |

FOREIGN PATENT DOCUMENTS 138203 10/1980 Japan ........................... 338/314

OTHER PUBLICATIONS

"Personal Mainframe's Design Shaped Dense n-MOS Technology", by D. Seccombe et al., Electronics, Sep. 22, 1983, especially at p. 168.

"A Monolithic Data Acquisition Channel", by R. K. Hester et al., IEEE Journal of Solid-State Physics, vol. SC-18, No. 1, Feb. 1983, especially at p. 60.

*Primary Examiner*—Donald A. Griffin
*Attorney, Agent, or Firm*—Lawrence D. Cutter; James C. Davis, Jr.; Marvin Snyder

[57] ABSTRACT

A capacitor structure which is particularly suitable for use in analog integrated circuit devices employs an intermediate layer of a refractory metal disposed in a thin layer overlying a flat dielectric surface. The thinness and the low reflectivity of the refractory metal facilitates precise patterning of the upper plate of the capacitor structure. In the present invention, capacitance is no longer determined by imprecise cuts through thick oxide layers or by patterning of thick metallization layers within these apertures. The use of refractory metals in the capacitor structure also readily permits the incorporation of resistive circuit elements.

19 Claims, 11 Drawing Figures

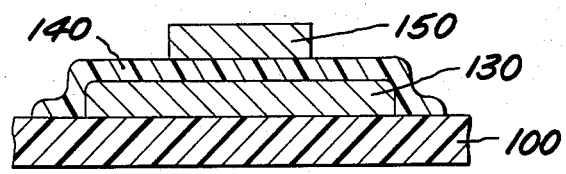
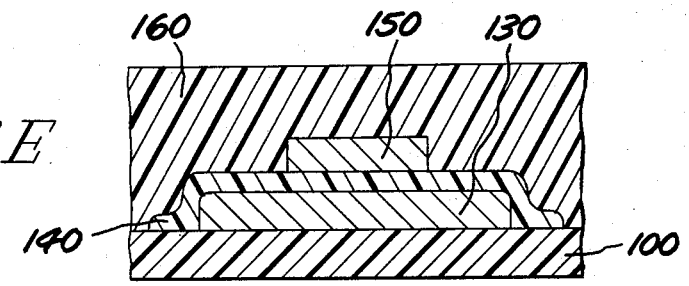
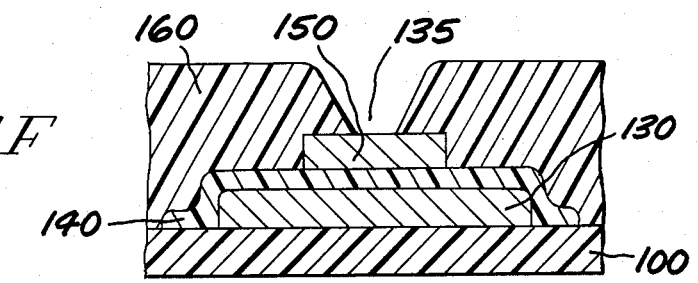
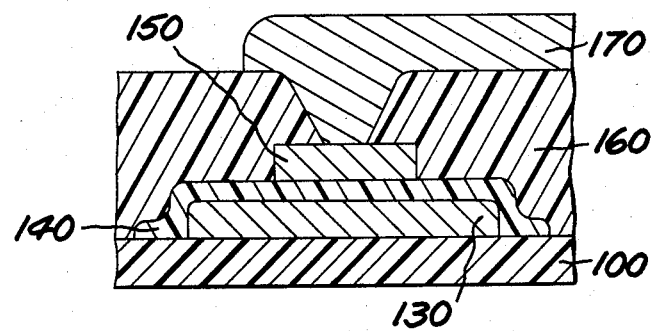
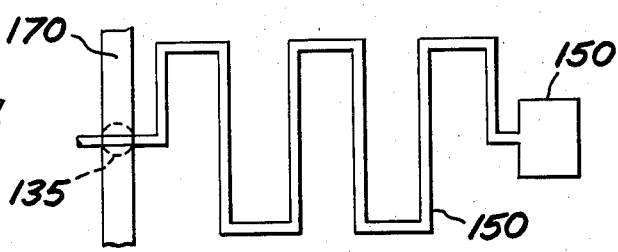

REFRACTORY METAL CAPACITOR STRUCTURES, PARTICULARLY FOR ANALOG INTEGRATED CIRCUIT DEVICES

BACKGROUND OF THE INVENTION

The present invention is generally directed to capacitor structures for use in analog integrated circuit applications. More particularly, the present invention relates to the use of refractory metals as an intermediate layer so as to produce capacitors with precisely controlled electrical characteristics.

Analog integrated circuits are presently employed in a large number of applications. These include analog to digital conversion devices, digital to analog conversion devices, filters, modulators, decoders, and other similar devices. It is naturally desirable to construct such analog circuits on small integrated circuit chips which are generally compatible with VLSI (Very Large Scale Integration) design patterns and rules. While it has generally been found to be very difficult to incorporate inductive circuit elements in such devices, it has been found necessary and desirable to employ integrated capacitive devices. However, the small scale employed in such devices, has made it difficult to control device characteristics. At present, analog integrated circuit devices use either capacitor structures in which the conductive capacitor "plates" comprise polysilicon in each plate or a structure comprising a metal "plate" in combination with a doped silicon structure operating as the opposing plate. These metal-to-doped silicon devices do not form electrically isolated structures; thus they exhibit disadvantages in some circuit applications, particularly analog applications. Devices of this type also have large voltage coefficients. Another problem with both types of devices is that they exhibit lower electrical circuit "Q" values since silicon or polysilicon has higher resistivity, in comparison with metals, by a factor of about 100. Similarly, metal-to-polysilicon or doped silicon contacts exhibit higher impedances by a factor of about 100, in comparison with metal to metal contacts. Yet another major difficulty associated with some of these devices is that their capacitance value is determined either by an oxide cut in a thick interlevel dielectric or by the patterning of a second metal inside this cut. Since both these alternatives require patterning of a thick layer, the reproducibility and the accuracy of the resulting capacitance value is low.

SUMMARY OF THE INVENTION

In accordance with a preferred embodiment of the present invention, a capacitor structure which is especially useful in very large scale analog integrated circuit devices comprises a structure which includes an intermediate layer of refractory metal. The refractory metal is disposed in a thin layer on top of a flat dielectric layer. The use of a thin refractory metal layer is important in the practice of the present invention since the result is a fine grained, thermally stable layer exhibiting a smooth surface with no hillock formation. It is the thinness of this layer which permits accurate patterning of this intermediate metal layer. Additionally, the use of refractory metals is important since these materials exhibit a low reflectivity which also permits improved accuracy for photoresist patterning exposure. Most importantly for the practice of the present invention, it is this layer which forms the upper plate of the capacitor structure. However, it is noted that a refractory metal may also be employed for the lower plate of the capacitor structure.

A capacitor structure in accordance with the present invention comprises an insulative substrate on which a first metal layer is disposed. A dielectric layer is deposited over this first metal layer and in turn is covered with a second layer, of refractory metal, as described above. An insulating layer is disposed over the refractory metal layer and possesses an aperture therein for connection to the second metal layer, this connection being made to an interconnecting metal layer or strip conductor disposed on the insulating layer and extending through the aperture. In the present invention, refractory metals such as chromium, titanium, tungsten, molybdenum, nickel, and alloys thereof, such as nichrome, may be employed.

In accordance with another embodiment of the present invention, a method for accurately producing capacitor structures in integrated circuit devices comprises a series of processing steps which are generally compatible with conventional integrated circuit manufacturing methods. In particular, a first metal layer is disposed on an insulative substrate. A dielectric layer is then disposed over this first metal layer so that the dielectric layer has a substantially flat upper surface in the region above the first metal layer. It is on this flat surface that the refractory metal layer of the present invention is disposed. An insulating layer is then disposed over the second metal layer and an interconnecting conductor is connected to the refractory metal layer through a via or opening in the insulating layer. In the present invention, deposition of the refractory metal layer may be performed either by sputtering, by chemical vapor deposition (CVD), by evaporation or by other means. In addition, it is noted that the refractory metal layer in the present invention may be disposed so as to provide an electrically resistive component in addition to the capacitor structure of the present invention. This ability is a direct consequence of the presence of an additional metal layer.

Accordingly, it is an object of the present invention to provide capacitor structures for use in integrated circuit devices which exhibit precisely controllable values of capacitance.

It is a further object of the present invention to provide capacitive structures, for integrated circuits, which may be electrically isolated from other circuit components and from circuit ground.

It is also an object of the present invention to provide a method for the production of capacitors in integrated circuit devices in a fashion which insures accurately determined electrical characteristics.

It is yet another object of the present invention to provide capacitor structures employing refractory metal components so as to permit the formation of series connected resistive and capacitive circuit elements and to provide an additional circuit layer employing conductive and resistive components.

Lastly, but not limited hereto, it is an object of the present invention to provide integrated circuit capacitor plates which are thin, exhibit low reflectivity, and are easily patterned to specifically controlled dimensions.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 2A-2G are cross sectional, side elevation views of the steps employed in the production of capacitive circuit elements in accordance with the present invention which is particularly shown in FIG. 2G;

FIG. 3 is a plan view illustrating one embodiment of the present invention in which the refractory metal employed is disposed so as to provide desired electrical resistive characteristics.

DETAILED DESCRIPTION OF THE INVENTION

Figure 1A:
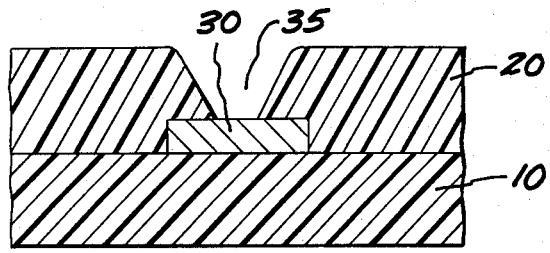
FIGS. 1A-1C are cross sectional, side elevation views illustrating previously employed steps in the production of integrated circuit capacitive elements.
Figure 1B:
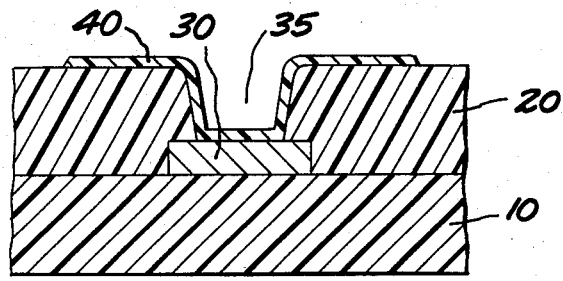
Figure 1C:
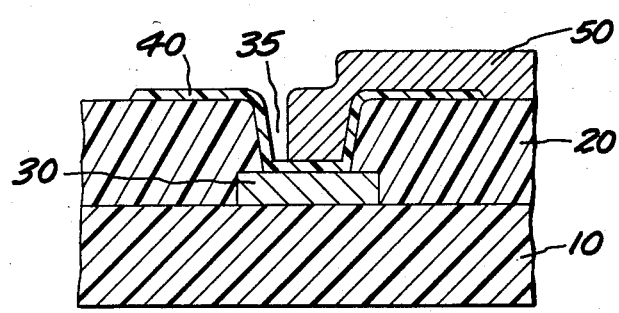

FIGS. 1A-1C illustrate a sequence of production steps conventionally employed in the formation of capacitor structures in large scale integrated circuit devices. In particular, it is seen that the capacitor structure is disposed on top of an underlying insulative layer 10. Typically, this layer comprises an interlevel dielectric material such as silicon oxide or silicon nitride or combinations thereof. Metal layer 30 is disposed on top of layer 10. In the past, metal layer 30 has typically comprised a material such as aluminum. However, the temperature coefficient of expansion of aluminum and similarly employed materials leads to parameter control problems. For example, the use of aluminum in layer 30 can result in the formation of bumps or hillocks of various dimensions and configurations so as to make it difficult to precisely control the electrical parameters of devices made using it, especially capacitors. Moreover, materials such as aluminum, exhibit reflectivities as high as 90%. This makes photoresist patterning more difficult than is desired.

Again, referring to FIG. 1A, it is seen that conventional processing disposes a second insulating layer 20 over layer 10 so as to completely cover metal layer 30 which eventually forms the lower plate of a capacitive structure. Of course, insulating layer 20 is provided with an aperture or via 35. However, since layer 20 is relatively thick, etching of material from layer 20 does not lend itself to precise control of the area of layer 30 which is exposed through the via. In this regard, it is important to realize that in general, the capacitance of a device is directly proportional to plate area and inversely proportional to the distance between the plates. In the present context, the distance between the electrically conductive elements of a capacitive structure (that is, the plates) is also the same as the dielectric thickness. However, the important point to note from FIG. 1A is that the shape and depth of aperture 35 does not result in the formation of precisely controlled areas.

FIG. 1B illustrates the next step in conventional capacitive structure formation. In particular, FIG. 1B illustrates the fact that a dielectric layer is added, typically by deposition. Dielectric layer 40 is seen to be disposed to as so fill aperture 35. Excess regions of layer 40 are then typically etched away leaving the structure shown in FIG. 1B. It is noted that dielectric layer 40 provides the capacitive structure with its dielectric material and that the choice of this material determines, at least in part, the resulting capacitance of the device. Again, however, it is noted also that the size and shape of aperture 35 is also at least partially determinative of the actual shape, thickness, and disposition of the dielectric material. It is also noted that distortions or hillocks in layer 30 adversely affect the precise control of any resulting capacitive structure.

In another form of conventional capacitor formation as illustrated in FIG. 1C, an interconnection metal layer or strip 50 is employed to complete the capacitive structure. More particularly, the capacitive structure comprises conventional conductive layer 30, dielectric layer 40, and interconnection metallization layer 50. Interconnection layer 50 typically comprises a relatively thick aluminum layer. More particularly, this layer is often about 5,000 angstroms in thickness. As is well known, precise patterning of thicker layers is difficult. However, it is also seen, from FIG. 1C that the patterning of interconnection metal 50 at the bottom of aperture or via 35 is determinative of the capacitance of the structure because the area of the upper plate of the capacitive structure is determined by this thick layer of interconnection metal which, because of its thickness, is difficult to pattern precisely. Thus, it is seen that conventional processing for the formation of capacitive structures in integrated circuits is difficult since the capacitance value is determined either by an oxide cut in a thick interlevel dielectric (layer 20) or by patterning a second (upper) metal layer inside a small via. Since both of these alternatives require the patterning of a thick layer, the reproducibility or precision of the capacitance value is not high. It is made more difficult by the use of conventional metals such as aluminum in layer 30 which tends to form hillocks. Additionally, metals such as aluminum tend to be dimensionally unstable.

It should also be noted that while layer 30 has been described above and is hatched in the Figures to denote metallic composition, it is also conventional practice to employ doped polysilicon as an electrically conductive material operating as the lower plate of a capacitive structure. This is particularly true in the case in which conductive layer 30 also functions as a direct connection or link to transistor gate electrodes. Also of note, is the fact that conductive layer 30 is indeed connected to other circuit elements, although this fact is not readily apparent from the cross sectional view. However, a plan view would typically illustrate conductive strip or layer 30 in connection with other circuit elements.

Figure 2A:
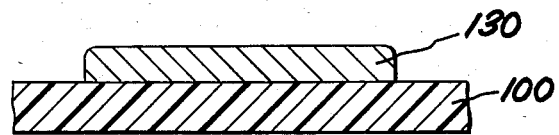
Figure 2B:
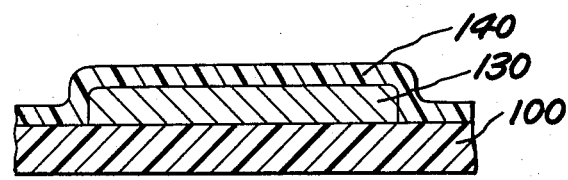

Attention is now directed to the formation of the capacitive structure in accordance with the present invention. More particularly, FIGS. 2A-2G illustrate various steps in accordance with the present invention. More particularly, FIG. 2G illustrates the structure which results from the method of the present invention.

Figure 2C:
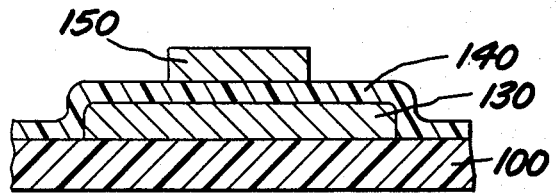

In the present invention, a first layer of metal 130 is disposed on insulative substrate 100. Typically, layer 100 comprises an interlevel dielectric layer of silicon oxide, silicon nitride, or combinations thereof in an integrated circuit, although layer 100 is not limited to such materials. For example, layer 100 may comprise aluminum oxide. At illustrated in FIG. 2B, dielectric layer 140 is then disposed over metal layer 130. It is noted herein that while layer 130 preferably comprises metal, it is also possible to employ doped polysilicon as layer 130. Next, dielectric layer 140 is disposed so as to cover layer 130. While it is certainly preferred that layer 140 entirely cover layer 130, this is not been to be essential to the practice of the present invention. Next, as shown in FIG. 2C, a second metal layer 150 is disposed so as to overlie layer 130. In accordance with the present invention, it is important to note that layer 150 comprises a refractory metal. Such metals include titanium, tungsten, molybdenum, chromium, nickel, and alloys thereof. Layer 150 may be formed either by sputtering or by chemical vapor deposition (CVD), by evaporation or by other means. Such formation methods result in the deposition of thin refractory metal layers. The low reflectivity of such metals and the thinness of the layers which may be formed permit precisely controllable patterning. It is this controlled patterning which provides the principal advantages found in the structure and method of the present invention. The resulting structure is particularly shown in FIG. 2C. It is appreciated by those skilled in the integrated circuit arts that layer 150 is typically formed by depositing material over the entire device and then selectively etching away undesired portions in accordance with a predetermined pattern. The essential features of the capacitive structure of the present invention are already present in FIG. 2C. More particularly, the conductive members 130 and 150 are seen to be present with dielectric material 140 therebetween. However, it is seen that the capacitive parameter of the resulting device is precisely controllable by precise patterning of layer 150. As pointed out above, precision patterning of this layer is promoted by its low reflectivity and its thin structure. Alternatively, it is also noted that layer 150 may be formed by CVD methods.

FIG. 2D illustrates that dielectric layer 140 is preferably trimmed to suitable dimensions and may not extend to distant portions of the circuit chip. FIG. 2E illustrates that insulating layer 160 is then disposed over the entire surface of the chip and in particular, is disposed so as to cover layer 150. Layer 160 is then provided with aperture of via 135 as is more particularly shown in FIG. 2F. To complete the preferable structure of the present invention, interconnection metal layer 170 is then deposited and patterned to provide a connection between the capacitive structure and other circuit elements. This is more particularly illustrated in FIG. 2G. It is to be particularly noted from this figure that the patterning of relatively thick interconnection metal 170 does not have any significant effect on the capacitive value of the structure shown. This value is precisely determined by controlling the patterning of layer 150, and concomitantly by insuring that dielectric layer 140 is possessed of a substantially flat upper surface. In the preferred embodiment of the present invention, the flatness of this surface is facilitated by employing refractory metals for layer 130.

In a preferred embodiment of the present invention, conductive layer 130 is typically about 5,000 angstroms in thickness. Layer 150 comprises a thin structure of refractory metal material which is typically less than about 3,000 angstroms in thickness. The thickness of layer 150 is particularly important for the control of capacitor dimensions. Since a precise control of capacitance is desired for analog circuit applications, the desired dimensional control is possible with a very thin layer of upper metal. A preferable thickness is approximately 2,000 angstroms. The thickness and composition of conductive layer 170 is not critical in the present invention. Its most desirable characteristic, however, is its ability to penetrate the aperture in layer 160 and to make reasonably good contact with layer 150. Dielectric layer 140 of the present invention typically comprises silicon oxide, silicon nitride, or combinations thereof. Additionally, multiple layers of these materials may also be employed. The dielectric layer itself is preferably approximately 3,000 angstroms in thickness and may be deposited by radio frequency enhanced plasma deposition methods.

An additional advantage of the structure of the present invention stems from the recognition that intermediate metal layer 150 is formed from a refractory metal and that such metals typically exhibit higher than average electrical resistivities. This higher resistivity property may be employed to advantage as shown in FIG. 3 in which it is seen that refractory metal layer 150 is patterned so as to provide a precisely controlled resistive circuit element. This element is shown connected in series with the capacitive structure of the present invention. However, it should be noted too that the use of the refractory metal layer herein also permits the fabrication of other conductive structures, such as resistors in the same chip layer. These other conductive structures are not necessarily electrically connected to the capacitive structure.

From the above, it should be appreciated that the present invention provides a capacitive structure for use in integrated circuit devices. The method of manufacture of this structure is in complete accord with conventional semiconductor manufacturing methods. Moreover, it is seen that the method of the present invention produces a capacitor structure in which the electrical parameters are precisely controllable. Accordingly, the present invention results in the availability of improved analog circuit chips for filters, demodulators, encoders, converters, and other such devices where it is particularly desirable to employ accurate standalone capacitive circuit elements. It is also seen that the present invention provides the means for forming a low leakage capacitor structure with precisely determinable electrical characteristics. The present invention also permits the utilization of higher resistivity materials such as nichrome for use as an upper capacitor plate so that precision resistors may also be fabricated from this circuit level. Accordingly, it is seen that all of the objects of the present invention are met by the method and apparatus disclosed herein.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A capacitor structure, for use in integrated circuit devices, said capacitor structure comprising:
    a substrate having an insulative layer disposed thereon;
    a first layer of conductive material disposed on said insulative layer on said substrate;
    a dielectric layer deposited over said first conductive layer;
    a layer of metal disposed on said dielectric layer, said layer of metal comprising a refractory metal;
    an insulative layer disposed over said refractory metal layer, said insulative layer having an aperture therein adjacent to at least a portion of said refractory metal layer; and
    an interconnection metal layer disposed on said insulative layer and extending through said aperture in said insulative layer so as to make contact with said refractory metal.

2. The capacitor structure of claim 1 in which said dielectric layer has a substantially flat upper surface in the region above said first conductive layer.

3. The capacitor structure of claim 1 in which said interconnection metal comprises aluminum.

4. The capacitor structure of claim 1 in which said refractory metal comprises material selected from the group consisting of chromium, titanium, molybdenum, tungsten, nickel, and alloys thereof.

5. The capacitor structure of claim 1 in which said refractory metal layer is formed by chemical vapor deposition.

6. The capacitor structure of claim 1 in which said refractory metal layer is formed by sputtering.

7. The capacitor structure of claim 1 in which said refractory metal layer is formed by evaporation.

8. The capacitor structure of claim 1 in which said refractory metal layer is less than approximately 3,000 angstroms in thickness.

9. The capacitor structure of claim 1 in which said first conductive layer is approximately 5,000 angstroms in thickness.

10. The capacitor structure of claim 1 in which said substrate insulative material comprises material selected from the group consisting of silicon oxide, silicon nitride, and combinations thereof.

11. The capacitor structure of claim 1 in which said dielectric layer comprises material selected from the group consisting of silicon oxide, silicon nitride, combinations thereof, and layers thereof.

12. The capacitor structure of claim 1 in which said insulative layer comprises material selected from the group consisting of silicon oxide, silicon nitride, and combinations thereof.

13. The capacitor structure of claim 1 in which said refractory metal layer is patterned so as to additionally provide at least one resistive circuit element.

14. A method for accurately producing capacitors in integrated circuits, said method comprising the steps of:
disposing a first conductive layer on a substrate having an insulative layer disposed thereon;
disposing a dielectric layer over said first conductive layer so that said dielectric layer has a substantially flat upper surface in the region above said first conductive layer;
disposing a refractory metal layer over said dielectric layer;
patterning said refractory metal layer;
providing a second insulative layer, said second insulative layer being disposed over said refractory metal layer; and
connecting, through an aperture in said second insulative layer, an interconnection conductor to said refractory metal layer.

15. The method of claim 14 in which said refractory metal is disposed by sputtering.

16. The method of claim 13 in which said refractory metal is disposed by chemical vapor deposition.

17. The method of claim 13 in which said refractory metal is disposed by evaporation.

18. The method of claim 13 in which said refractory metal is disposed in a serpentine pattern.

19. The method of claim 14 in which said refractory metal layer comprises material selected from the group consisting of chromium, titanium, tungsten, molybdenum, nickel, and alloys thereof.

* * * * *